Aug. 20, 1968 D. J. SIEBOLD 3,398,238

DEVICE FOR MOUNTING AND ELECTRICALLY ISOLATING
COMPONENTS OF A TELEVISION RECEIVER

Filed Feb. 19, 1965

INVENTOR:
DONALD J. SIEBOLD,

BY William S. Wolfe
HIS ATTORNEY.

United States Patent Office 3,398,238

Patented Aug. 20, 1968

3,398,238

DEVICE FOR MOUNTING AND ELECTRICALLY ISOLATING COMPONENTS OF A TELEVISION RECEIVER

Donald J. Siebold, North Syracuse, N.Y., assignor to General Electric Company, a corporation of New York Filed Feb. 19, 1965, Ser. No. 434,046
3 Claims. (Cl. 178—7.8)

ABSTRACT OF THE DISCLOSURE

A cathode ray tube with a conductive outer surface is mounted on and isolated from a die cast metal mask including a plurality of screw receiving boss members. A wire sling surrounding the cathode ray tube is encircled by a plurality of flexible conductive straps, each strap including an aperture at both extremities. The apertures on each strap are aligned, clamped between two insulative interlocking annular members which extend through the apertures, and positioned over one boss member. A screw is inserted through the apertures, the annular members, and the boss member.

Figures 1, 2:
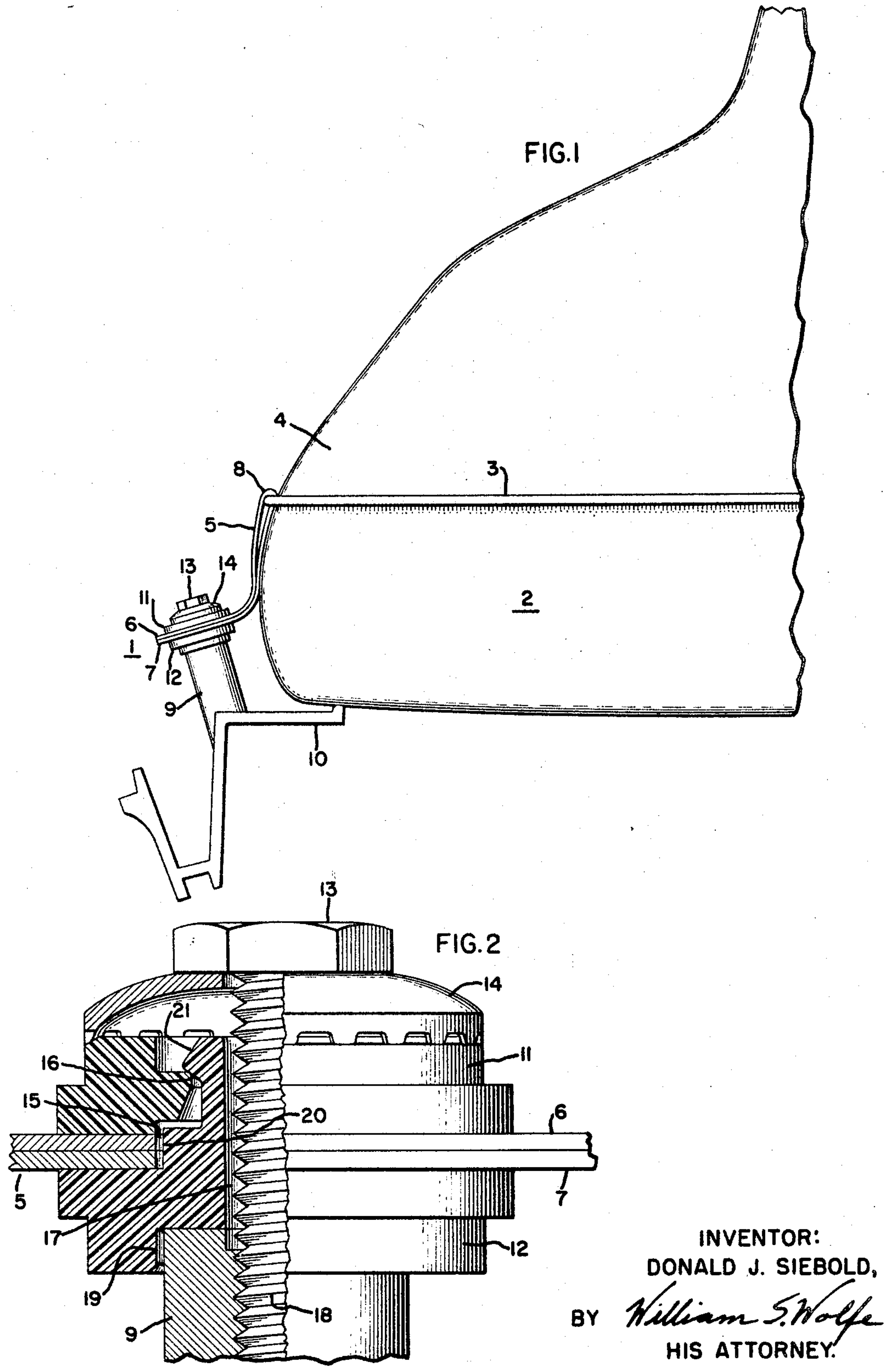

The present invention relates to the mounting of components of a television receiver and more specifically to a device for mounting and electrically isolating components such as a cathode ray tube.

It is desirable in many applications to employ a television chassis of the transformerless type. In such a transformerless chassis the metal chassis itself and other conductive elements electrically connected thereto are at the line potential. It is further desirable in many applications to mount such elements to conductive support members of the television receiver which are easily contacted by a person from the outside of the receiver cabinet. In this regard, it is desirable to mount the cathode ray tube to a die cast metal mask which is easily contacted from the front of the receiver. Thus, since in the transformerless type chasis the conductive coating on the funnel of the cathode ray tube is at line potential, it becomes imperative to electrically isolate the cathode ray tube from the die cast metal mask to which it is mounted in order to prevent the application of a dangerous voltage to the mask.

Similarly, it is necessary to electrically isolate various other components which are at the line potential from easily contacted conductive support members to which they are mounted. It becomes especially necessary to provide such isolation where metal cabinets are employed. It is also desirable that the device whereby isolation is achieved be such that this device is not subject to inadvertent discard should disassembly be necessary.

In the past, the problem of isloation has been approached by utilizing insulative rather than conductive members for supporting the various components. Thus, insulative masks have been employed for mounting the cathode ray tube. However, in many applications due to considerations of cost and strength it becomes desirable to use die cast metal support members such as a die cast mask for mounting the cathode ray tube.

The prior art which did employ conductive support members required the use of relatively complex and expensive devices for isolation, such devices necessitating time consuming assembly operations incompatible with mass production techniques. Further, the prior art devices were often inadvertently discarded upon disassembly of the component in question, the component then being reassembled without the necessary isolation.

The present invention presents an improved device for mounting and electrically isolating a component at line potential to a conductive support member accessible from outside the receiver.

Accordingly, an object of the invention is to provide an improved device for mounting and electrically isolating components of a television receiver.

Another object is to provide a simple and inexpensive device for mounting and electrically isolating components of a television receiver.

Yet another object is to provide an improved device for mounting components of a television receiver to conductive support members accessible from outside the cabinet.

Still another object is to provide an improved device for mounting and electrically isolating components of a television receiver, such device not being subject to inadvertent discard upon disassembly.

These and other objects are achieved in one embodiment of the invention through the use of a device including first and second annular insulative members for mounting and electrically isolating the desired component. Specifically, a cathode ray tube is mounted to a die cast mask through the use of conductive mounting sling surrounding the funnel of the cathode ray tube, the conductive mounting sling thus being at line potential as is the conductive coating on the funnel of the tube. A metal strap is looped around the mounting sling, the end portions of the strap being positioned in parallel abutting relationship and an aperture being provided therein. The first insulative annular member is positioned on one side of the strap in coaxial alignment with the aperture whereas the second annular member is similarly aligned on the opposite side of the strap. The second annular member has a reduced diameter portion which extends into the aperture and further includes axially extending resilient fingers extending through the aperture to lockedly engage the first annular member. In this manner the first and second annular members are locked in place and are not easily removed from the strap. A screw extends through the opening in the annular members, the screw thus being electrically isolated from the strap and being received by the associated boss to mount the cathode ray tube to the die cast mask with the necessary isolation.

The novel and distinctive features of the invention are set forth in the appended claims. The invention itself, together with further objects and advantages thereof, may best be understood by reference to the following description and accompanying drawings in which:

FIGURE 1 is a partial view of a cathode ray tube mounted in accordance with the invention, and FIGURE 2 is a partial sectional view of the mounting device employed in FIGURE 1.

Referring to FIGURE 1, there is shown a mounting device 1 in accordance with the invention for mounting and electrically isolating a cathode ray tube generally shown at 2. A mounting sling 3 is provided surrounding the funnel portion of the cathode ray tube. The mounting sling 3 is most advantageously a metal wire. Thus, since the conductive surface 4 of the cathode ray tube 2 is at line potential when a transformerless chassis is employed, the mounting sling 3 is similarly at line potential and must be isolated from the associated conductive support member.

A metal strap 5 is provided for engaging fastening means in the form of the mounting sling 3, the metal strap 5 passing around the mounting sling 3 and having its end portions 6 and 7 disposed in parallel abutting relationship thus defining an intermediate bight portion 8 therebetween. The cathode ray tube 2 is mounted by assembling the metal strap 5 to a boss 9 integrally formed with a die cast metal mask 10, the mask 10 being similar to the type conventionally employed in television receivers. Mounting of the metal strap 5 to the boss 9 with the requisite electrical isolation is effected through the use of first and second insulative annular members 11 and 12 which permit the screw 13 to pass through a suitable aperture in the strap without contacting the strap. A concave washer 14 is interposed between the head of the screw 13 and the annular insulative member 11 to distribute the force developed by the screw.

It will be appreciated that although a single mounting device has been shown in FIGURE 1 for the purposes of simplicity, a plurality of such devices would ordinarily be employed in order to provide a suitable mount. Thus, four such mounting devices 1 might be employed, one mounting device 1 engaging the mounting sling 3 at each corner of the cathode ray tube envelope.

Referring now to FIGURE 2, there is shown in detail the mounting device 1 of FIGURE 1. As discussed above, the end portions 6 and 7 of the metal strap 5 are sandwiched between the annular members 11 and 12 in parallel abutting relationship, an aperture 15 being provided through the end portions 6 and 7 of the metal strap 5 to permit the screw 13 to pass therethrough.

The first annular member 11 includes an internal shouldered portion 16 adapted to be lockedly engaged by the second annular member 12. The second annular member 12 is provided with a centrally located aperture 17 adapted to receive the thread portion 18 of screw 13, the annular member 12 being countersunk at 19 to receive the top of the boss 9. The annular member 12 is further provided with a decreased diameter portion 20 adapted to extend through the aperture 15. The annular member 12 is additionally provided with a plurality of axially extending resilient fingers 21, a single such finger being shown in FIGURE 2. The resilient fingers 21 engage the shoulder portion 16 of the first annular member 11 to lock the annular members 11 and 12 together with the end portions 6 and 7 of the strap 5 sandwiched therebetween.

The screw 13 passed through the aperture 17 and is received by the boss 9 to thereby mount the strap 5 to the boss, the annular members 11 and 12 isolating the screw from the strap 5 in the necessary manner. The concave washer 14 is interposed between the head of the screw 13 and the first annular member to distribute the force developed when the screw is threaded into the boss 9 to the annular member 11.

Thus, through the use of the first and second annular members 11 and 12 of the invention, the requisite isolation is achieved in simple and inexpensive fashion. Further, since the annular members 11 and 12 are locked together, the danger of a loss of isolation through inadvertence in disassembly and subsequent reassembly is substantially eliminated. Yet further, it will be appreciated that the device of the invention is easily hand assembled by inserting the annular member 12 in the aperture of the strap 5 and then snapping the annular member 11 on the extending resilient fingers 21.

Although the invention has been described with respect to certain specific embodiments, it will be appreciated that modifications and changes may be made by those skilled in the art without departing from the spirit and scope of the invention. In particular, the mounting device of the invention might be employed for mounting and electrically isolating components other than a cathode ray tube to conductive support elements easily contacted from outside the receiver cabinet.

What is claimed as new and desired to be secured by Letters Patent of the United States:

1. An apparatus for mounting an electrical component to a conductive member having a screw receiving boss thereon, said apparatus comprising, (a) a flexible conductive strap member having an aperture at one end thereof,
(b) fastening means securing said strap member to said electronic component,
(c) a first annular insulative member positioned on one side of strap member,
(d) a second annular insulative member positioned on the opposite side of said strap member, said second annular member including a smaller diameter portion received by said aperture and having axially extending resilient fingers extending through said aperture to lockedly engage said first annular member, and
(e) a threaded member extending through said aperture into said boss to mount said strap member to said conductive member in electrically isolated fashion.

2. An apparatus for mounting an electrical component to a conductive member having a screw receiving boss thereon, said apparatus comprising, (a) a flexible conductive strap member having an aperture at one end thereof,
(b) fastening means for securing said strap to said electronic component,
(c) a first annular insulative member positioned on one side of said strap member in coaxial alignment with the aperture in said strap member, said first annular member including an internal shouldered portion,
(d) a second annular insulative member positioned on the opposite side of said strap member in coaxial alignment with the aperture in said strap member, said second annular member including a smaller diameter portion received by said aperture and having axially extending resilient fingers extending through said aperture to lockedly engage said shouldered portion of said first annular member, and
(e) a screw extending through said aperture into said boss to mount said strap member to said conductive member in electrically isolated fashion, and
(f) a concave washer interposed between the head of said screw and said first annular member to distribute force developed by said screw to said first annular member.

3. Apparatus for mounting a cathode ray tube to a conductive mask having a screw receiving boss thereon, said apparatus comprising, (a) a conductive sling surrounding the funnel portion of said tube,
(b) strap means comprising an elongated conductive strap having each end portion positioned in parallel abutting relationship one with the other with an intermediate bight portion therebetween, and with said conductive sling extending through the loop defined by said bight portion, said strap means having an aperture extending through each end portion of said conductive strap,
(c) a first annular insulative member positioned on one side of said strap means,
(d) a second annular insulative member positioned on the opposite side of said strap member, said second annular member including a smaller diameter portion received by said aperture and having axially extending resilient fingers extending through said aperture to lockedly engage said first annular member,
(e) a screw extending through said aperture into said boss to mount said strap means to said conductive mask in electrically isolated fashion, and
(f) a concave washer interposed between the head of said screw and said first annular member to distribute the force developed by said screw to said first annular member.

References Cited

UNITED STATES PATENTS

| | | | |
|---|---|---|---|
| 3,084,217 | 4/1963 | Flore et al. | |
| 3,202,757 | 8/1965 | Carlson et al. | 174—153 |

FOREIGN PATENTS

| | | |
|---|---|---|
| 1,138,562 | 6/1957 | France. |

ROBERT L. GRIFFIN, *Primary Examiner.*

R. K. ECKERT, Jr., *Assistant Examiner.*